(12) United States Patent
White

(10) Patent No.: US 6,592,128 B2
(45) Date of Patent: Jul. 15, 2003

(54) INTEGRATED PNEUMATIC O-RING GASKET FOR MEMS DEVICES

(75) Inventor: Richard P. White, Land Mills, PA (US)

(73) Assignee: Agilent Technologies, Inc., Palto Alto, CA (US)

( * ) Notice: Subject to any disclaimer, the term of this patent is extended or adjusted under 35 U.S.C. 154(b) by 0 days.

(21) Appl. No.: 09/852,010

(22) Filed: May 10, 2001

(65) Prior Publication Data

US 2002/0167135 A1 Nov. 14, 2002

(51) Int. Cl.[7] .................................................. F16J 15/02
(52) U.S. Cl. .................... 277/628; 277/630; 277/640
(58) Field of Search ............................... 277/628, 630, 277/637, 640; 77/23.42; 137/884

(56) References Cited

U.S. PATENT DOCUMENTS

| | | | | |
|---|---|---|---|---|
| 3,578,346 A | * | 5/1971 | Jelinek | 277/611 |
| 3,661,166 A | * | 5/1972 | Dickason | 137/269 |
| 4,335,697 A | * | 6/1982 | McLean | 123/525 |
| 5,145,190 A | * | 9/1992 | Boardman | 277/596 |
| 5,564,714 A | * | 10/1996 | Katsuno et al. | 277/630 |
| 5,567,868 A | | 10/1996 | Craig et al. | 73/23.42 |
| 5,686,657 A | | 11/1997 | Craig et al. | 73/23.42 |
| 5,730,448 A | * | 3/1998 | Swensen et al. | 277/630 |
| 5,735,532 A | * | 4/1998 | Nolan et al. | 277/630 |
| 5,767,384 A | | 6/1998 | Wang et al. | 73/23.21 |
| 5,792,943 A | | 8/1998 | Craig | 73/61.52 |
| 5,988,652 A | * | 11/1999 | Martin et al. | 277/634 |
| 6,260,854 B1 | * | 7/2001 | Lemon | 277/609 |

OTHER PUBLICATIONS

Apple Rubber Products Inc., "The Way To Seal", Feb., 1998, p.p. 1–3.
Hewlett–Packard Company, www.hp.com/go/chem, "Capillary Columm Connectors" p. 94.
Humphrey Products Company, "Pneumatic & Electronic Automation", p.p. 38, Oct., 1994.
Pneutronics, 10 mm Small Reliable Solenoid "SRS" Valve.

* cited by examiner

Primary Examiner—Anthony Knight
Assistant Examiner—William D Hutton

(57) ABSTRACT

A gasket for sealing interfaces between a micro-machined device and a macroscopic connection to the device. The gasket can include an o-ring, a frame, a tool post and a notch. Alignment of the tool post with a dimple formed in or through a surface of a component adjacent to the gasket facilitates alignment of the gasket. The notch and frame can also facilitate alignment of the gasket.

19 Claims, 6 Drawing Sheets

INTEGRATED PNEUMATIC O-RING GASKET FOR MEMS DEVICES

BACKGROUND OF THE INVENTION

1. Field of the Invention

The present invention relates generally to gaskets used for providing seals between micro-machined devices and connections to the micro-machined devices.

2. Description of the Related Art

FIG. 1 illustrates a cross-sectional view of an apparatus 10 according to the related art. The apparatus 10 illustrated in FIG. 1 includes a planar manifold 20 having a manifold inlet 30 on one of its surfaces and a manifold outlet 40 on another of its surfaces. In between the inlet 30 surface and outlet 40 surface are a series of micro-machined components that allow the apparatus 10 to function according to a specified purpose. For example, the apparatus 10 could function as part of a gas chromatograph, as discussed in U.S. Pat. No. 5,567,868 to Craig et al., incorporated herein in its entirety by reference.

Adjacent to the surface of the planar manifold 20 that includes the inlet 30 are positioned, sequentially, an o-ring gasket 90 and a diffusion-bonded plate 80. The diffusion-bonded plate 80 effectively "squeezes" the gasket 90 and, if the gasket 90 is positioned properly relative to the inlet 30 and the plate 80, the squeezed gasket 90 is reshaped to form seals with the planar manifold 20 and the diffusion-bonded plate 80. The pathway to the inlet 30 (through the gasket 90 and the diffusion-bonded plate 80) allows for a sample to be introduced into the apparatus 10.

FIG. 2 illustrates an elevated, top perspective view of the related art o-ring gasket 90 included in FIG. 1. The o-ring gasket 90 includes a web 100 and several o-rings 110 molded into the web 100. When the gasket 90 is properly positioned relative to a planar manifold 20, the o-rings 110 in the gasket 90 are centered around the inlets 30 of the manifold 20. In this position, when squeezed by the diffusion-bonded plate 80, the gasket 90 forms seals with the planar manifold 20 and the diffusion-bonded plate 80. These seals prevent the sample introduced into the planar manifold 20 from leaking out of the apparatus 10.

Among the disadvantages of the related art apparatus 10 and related art o-ring gasket 90 is the inherent difficultly of properly aligning the o-rings 110 relative to the inlets 30. Unless care and caution are used to position the o-ring gasket 90, proper seals will not be formed and the sample may leak out of the apparatus 10. The sample will also leak out of the system if the o-ring gasket 90 is not properly aligned with respect to the diffusion-bonded plate 80.

Hence, what is needed is a method of conveniently and cost-effectively manufacturing an o-ring gasket that can be conveniently positioned between a planar, micro-machined device and/or a plate that compresses the o-ring gasket to create a seal.

BRIEF SUMMARY OF THE INVENTION

According to one embodiment, a gasket for sealing an interface to a micro-machined device that includes a web for placement adjacent to the micro-machined device wherein the web includes an aperture and a tool post protruding from a first surface of the web.

According to another embodiment, a gasket for creating an interface to a micro-machined device that includes a web for placement adjacent to the micro-machined device wherein the web includes an aperture and a frame protruding from a first surface of the web.

According to yet another embodiment, a micro-injector that includes an injector die and a first o-ring gasket adjacent to a first surface of the injector die, wherein the first o-ring gasket includes a web adjacent to the injector die, an o-ring in the web, and a tool post protruding from a surface of the web.

BRIEF DESCRIPTION OF THE DRAWINGS

The invention will be described by way of example, in the description of exemplary embodiments, with particular reference to the accompanying drawings in which.

DETAILED DESCRIPTION OF THE INVENTION

Figure 1:
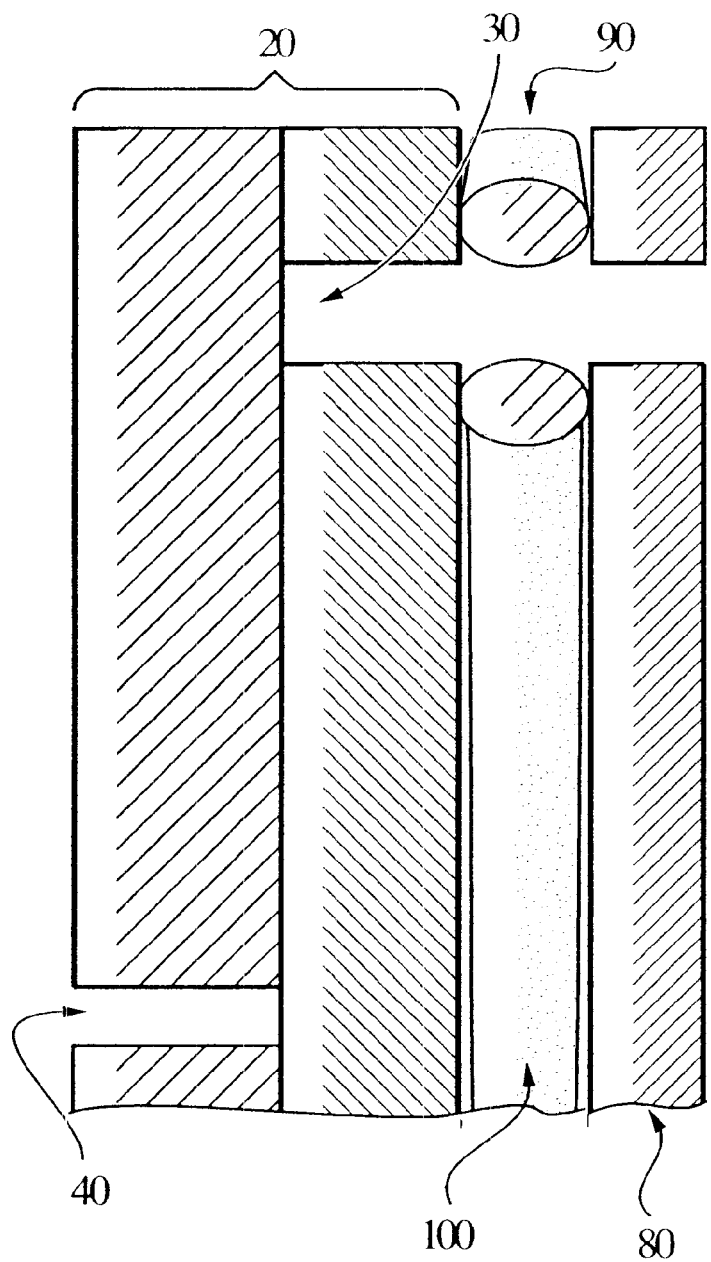
FIG. 1 illustrates a cross-sectional view of an apparatus according to the related art wherein an o-ring gasket forms a seal between a planar manifold and a diffusion-bonded plate.
Figure 2:
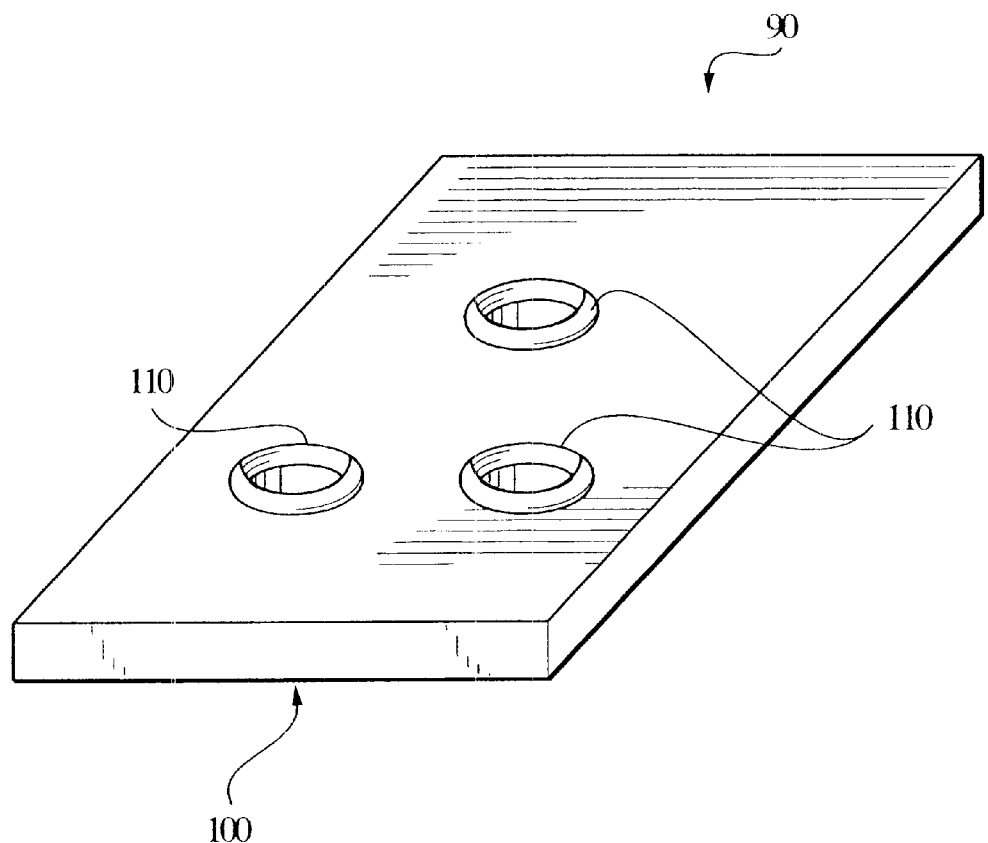
FIG. 2 illustrates a top perspective view of an o-ring gasket according to the related art wherein o-rings are included within the webbing of the gasket.
Figure 3:
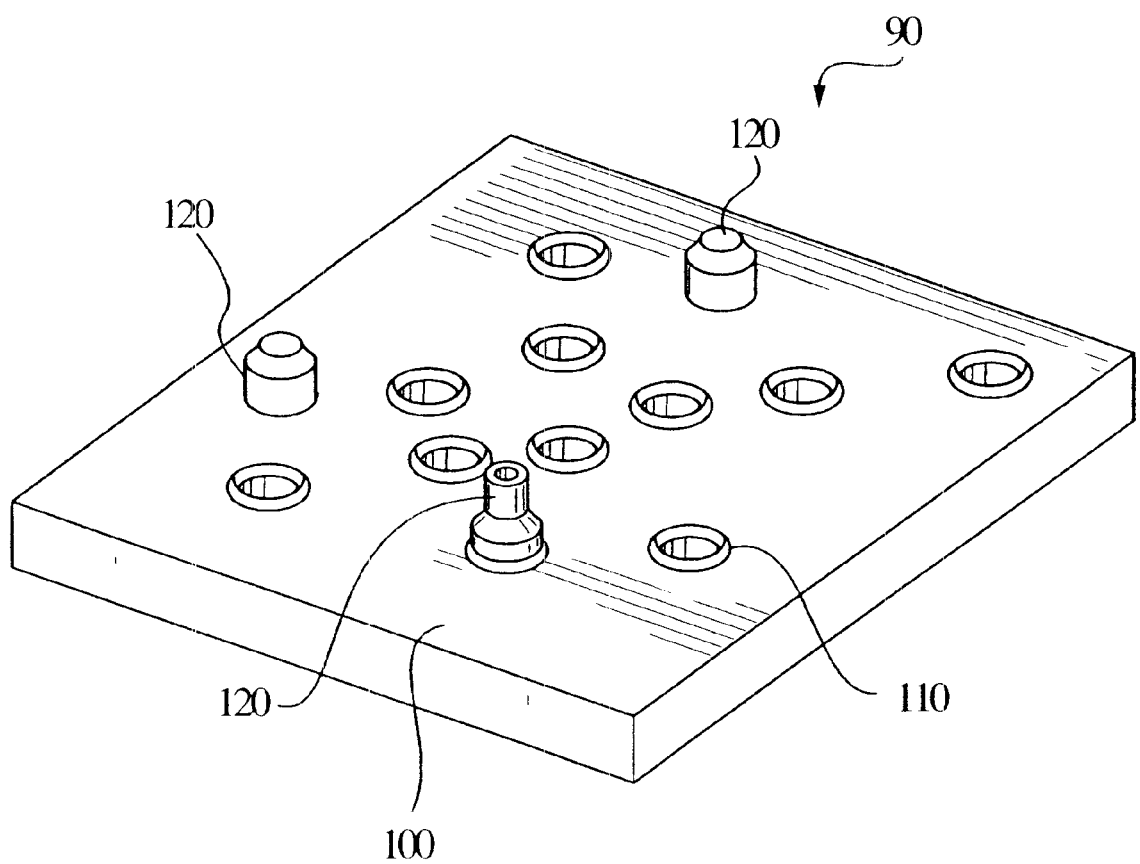
FIG. 3 illustrates a top perspective view of an o-ring gasket wherein o-rings are included in the webbing of the gasket and tool posts protrude from the webbing.

FIG. 3 illustrates an o-ring gasket 90 according to one embodiment of the present invention. The o-ring gasket 90 illustrated in FIG. 3 includes a web 100 containing apertures. Protruding from the web 100 are a plurality of tool posts 120. Although the apertures in FIG. 3 are o-rings 110, other configurations for apertures that provide a pathway through the web 100 of the gasket 90 are also within the scope of the present invention.

The web 100 can be made from any material capable of containing apertures that provide a pathway through the web 100 and that also provides sufficient structural support for tool posts 120 or other objects that protrude from the web 100. According to the certain embodiments of the present invention, the web 100 is made from a rigid material, such as, but not limited to, a plastic, ceramic or metal. According to certain embodiments, the material of the web 100 is chosen to be resistant to corrosion from gases or liquids that flow through the planar manifold 20 discussed above. The dimensions of the web 100 can include, but are not limited to, a quarter of a millimeter of thickness, and several centimeters of length and width.

Although gaskets 90 within the scope of the present invention can be placed adjacent to any planar manifold 20 such as an injector die used in a gas chromatography apparatus, the gaskets 90 can also be used in conjunction with other types of planar devices. Specific examples of other planar devices within the scope of the present invention include, but are not limited to, micro-machined valves and sensors, and any micro-electro-mechanical systems (MEMS) device.

The o-rings 110 that can be used as the apertures in the web 100 include commercially-available o-rings 110 that have one-half-millimeter inner diameters. However, any dimension of o-ring 110 that allows for a sample to travel into the planar manifold 20 to which the gasket 90 is adjacent and with which the gasket 90 creates a substantially leak-proof seal is also within the scope of the present invention.

According to certain embodiments of the present invention, the o-ring 110 can be thicker than the web 100. For example, if a web 100 with a one-quarter-millimeter thickness is chosen, an o-ring 110 with a one-half-millimeter thickness can be molded into the web 100. Using an o-ring 110 that is thicker than the web 100 in which it is included allows for a diffusion-bonded plate 80 to compress the o-ring 110 between the plate 80 and the surface of the planar device adjacent to the o-ring 110. This compression forms seals between the surface and the o-ring 110 and between the o-ring 110 and the plate 80.

According to certain embodiments, one or more o-rings 110 in the web 100 can be made from an elastomer material. Also, the o-rings 110 can include materials that are durable under compressive stresses such as, but not limited to, those stresses experienced when the o-ring gasket 90 is compressed by the diffusion-bonded plate 80. Further, the o-ring 110 can include material that is chemically un-reactive with the sample introduced into the planar device.

The tool posts 110 illustrated in FIG. 3 protrude from only one surface of the web 100. However, in other embodiments of the present invention, the tool posts 110 can protrude from more than one surface of the web 100 (See FIG. 6). As shown in FIG. 3, the tool posts 120 can protrude different distances from the surface of the web 100 and can have different geometries. Examples of such geometries include, but are not limited to, cylindrical shapes, hemispherical shapes, and tapered shapes. Also, the tool posts 120 can be made from rigid materials such as, but not limited to, hard plastics, ceramics and metals. One or more tool posts 120 can be arranged in any configuration on the web 100.

Although o-rings 110 are illustrated in FIG. 3, other apertures and geometries can be used within the scope of the present invention. For example, square, triangular, or irregularly shaped apertures can be used, so long as a seal can be formed between the gasket 90 and the planar device surface to which the gasket 90 is adjacent.

One or more apertures or o-rings 110, such as those illustrated in FIG. 3, can be positioned almost anywhere on the web 100. The number of total apertures is not limited in the present invention, so long as the gasket 90 does not lose its structural integrity due to having too many holes formed within it.

According to certain embodiments of the present invention, some of the o-ring 110 are "filled in" by another material and do not provide pathways through the web 100. These "filled in" o-rings can be used to relieve and/or redistribute compressive stresses in other o-rings 110 and in the web 100.

According to certain embodiments of the present invention, the gasket 90 contains a number of apertures equal to the total sum of inlets 30 and outlets 40 in the planar manifold 20 adjacent to the gasket 90. These embodiments can be used in planar devices where a gasket 90 is needed on both a first surface of the apparatus 10 containing inlets and a second surface of the apparatus 10 containing outlets. Embodiments that allow for identical gaskets 90 to be placed on both surfaces of the planar device only require that one type of gasket 90 be designed and manufactured. Such embodiments can therefore reduce the overall cost of manufacturing the apparatus 10.

Figure 4:
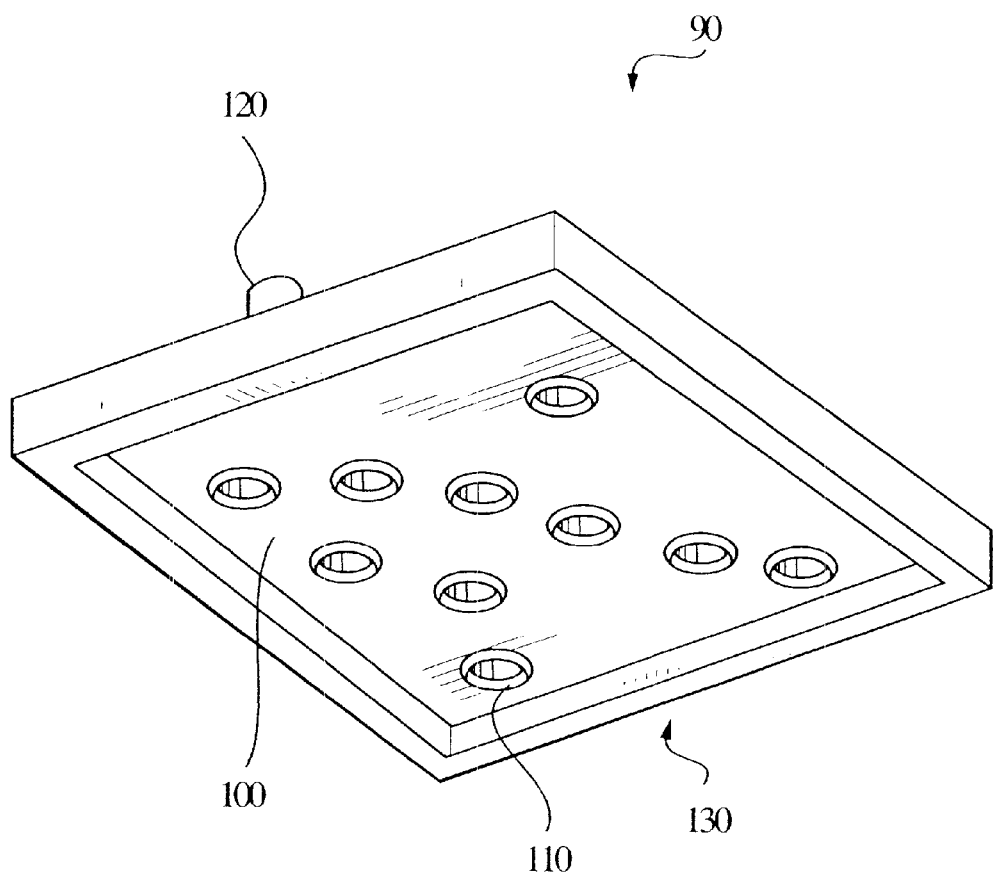
FIG. 4 illustrates a bottom perspective view of an o-ring gasket wherein a frame protrudes from the perimeter of the webbing.

FIG. 4 illustrates a bottom, perspective view of a gasket 90 according to another embodiment of the present invention. In addition to the web 100, apertures, and protrusions discussed above, the o-ring gasket 90 illustrated in FIG. 4 includes a frame 130. This frame 130 can protrude from one or more surfaces of the web 100 and allows for the o-ring gasket 90 to be more easily positioned relative to the device adjacent to the gasket 90.

The frame 130 can be made from a rigid material or a flexible material. According to certain embodiments, the web 100 and the frame 130 are made from elastomers that can be "stretched" to fit around the perimeter of the planar device to which the gasket 90 is adjacent. Regardless of whether the frame 130 is stretched around the perimeter of the device surface or fits without stretching, once the frame 130 is in place, all of the apertures are, at the same time, also positioned relative to the device in a manner conducive to forming seals.

The frame 130 can also be positioned relative to the diffusion-bonded plate 80 (or other planar surface) in a similar manner. For example, if the frame 130 is stretched or otherwise positioned around the perimeter of the diffusion-bonded plate 80, the o-rings 110 in the gasket 90 will, at the same time, line up with apertures in the plate 80.

Figure 5:
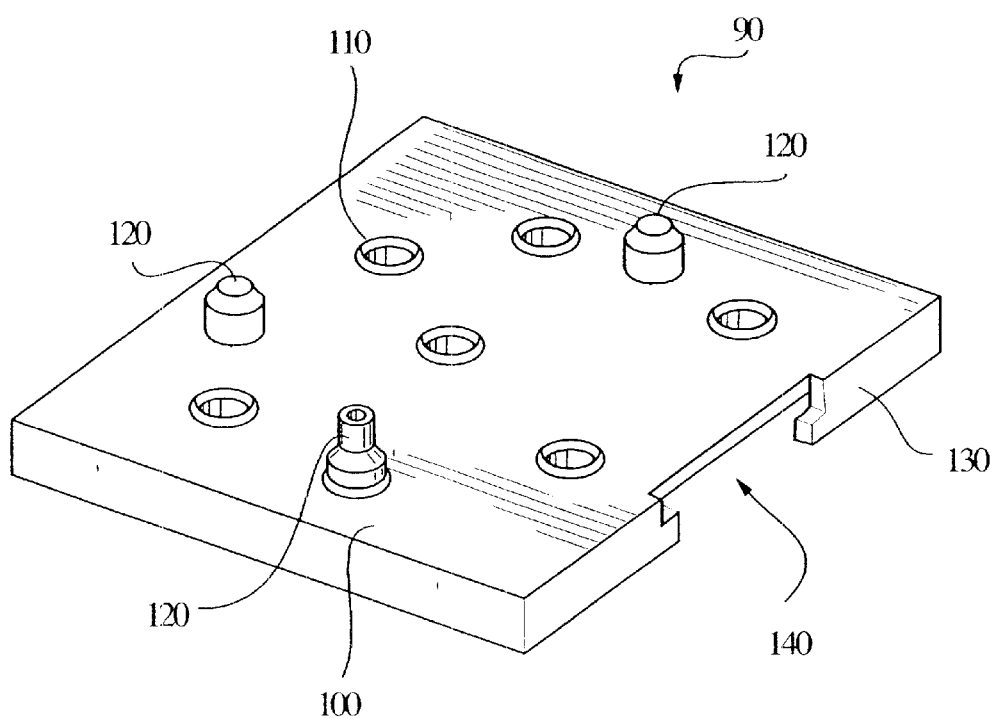
FIG. 5 illustrates a top perspective view of an o-ring gasket wherein a notch is formed in the frame and webbing.

FIG. 5 illustrates yet another embodiment of the present invention wherein a gasket 90 includes a notch 140 formed within one side of it. Although only one notch 140 is illustrated in FIG. 5, more than one notch 140 can be present in certain gaskets 90 within the scope of the present invention.

The notch 140 can be formed exclusively in the frame 130 portion of the gasket 90, exclusively in the web 100, or can be formed in the frame 130 and in the web 100. The dimensions and geometry of the notch 140 are not restricted by the present invention. For example, rectangular, hemispherical, irregularly shaped or triangular notches 140 can be formed and the widths, diameters, and lengths of the notches 140 can vary.

Figure 6:
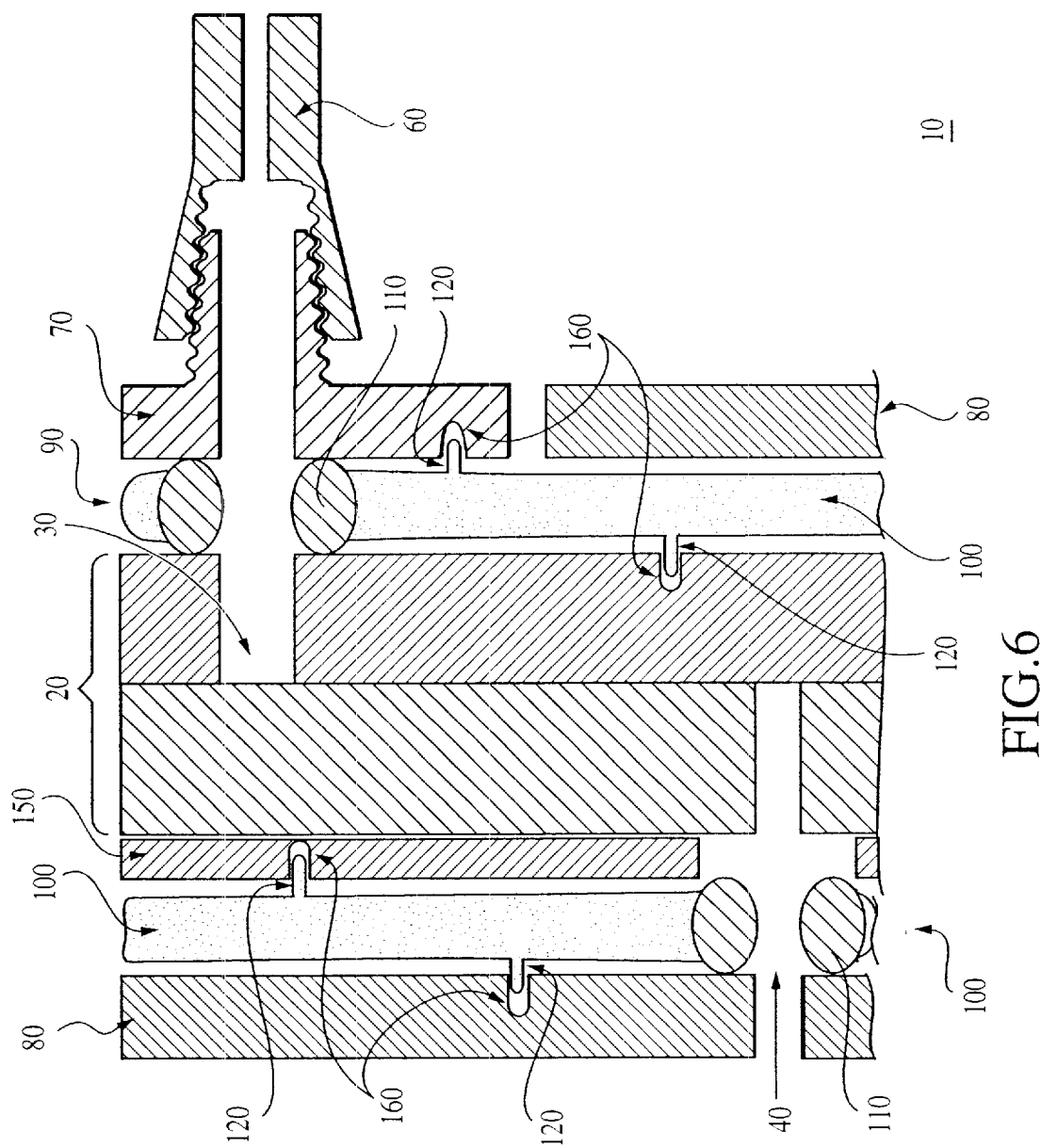
FIG. 6 illustrates a cross-sectional view of an apparatus positioned between two o-ring gaskets and a heater element.

FIG. 6 is a cross-sectional view of another embodiment of the present invention illustrating a planar manifold 20 that takes the form of an injector die for in a micro-injector for a gas chromatography apparatus 10. The planar manifold 20 die is positioned between a first o-ring gasket 90 and a heater 150 that is included to help prevent condensation in the die of the gas to be analyzed. To the outside of the first o-ring gasket 90 is positioned a first diffusion-bonded plate 80 and to the outside of heater 150 is positioned a second o-ring gasket 90. To the outside of the second o-ring gasket 90 is positioned a second diffusion-bonded plate 80.

The first o-ring gasket 90 contains two tool posts 120, in this example, that each fit into one of the corresponding dimples 160 formed on the surfaces of the injector die and first diffusion-bonded plate 80, respectively. Dimples 160 that accommodate the presence of the tool posts 120 in the second o-ring gasket 90 are also present on the surfaces of the heater 150 and second diffusion-bonded plate 80.

Although dimples 160 are illustrated in FIG. 6, the tool posts 120 may, according to other embodiments of the present invention, fit into or protrude through other features such as, but not limited to, holes that go completely through the component to which the gasket 90 is adjacent. For example, instead of the dimples 160 shown, some embodiments of the present invention have holes that accommodate the tool posts 120 and go through either the diffusion-bonded plate 80, the heater 150 or a fitting 70.

The fitting 70 is attached, generally by welding, to the first diffusion-bonded plate 80. A connector 60 that allows for a sample to be introduced into the injector die is fastened to the fitting 70. Various fittings 70 can be used according to certain embodiments of the present invention. These fittings 70 include, but are not limited to, ZDV fittings, press-fit unions and nut and ferrule sets. The fitting 70 can include one or more dimples 160 that, when properly aligned with respect to the first gasket 90, surrounds one of the tool posts 160 on the first gasket 90.

The dimples 160 in conjunction with tool posts 120 provide for easier positioning of the gaskets 90. In other words, the gaskets 90 are designed such that, when the tool posts 120 rest in the dimples 160, the apertures or o-rings 110 are properly positioned respective to the inlets 30 and outlets 40 to accommodate the formation of seals.

Although not shown, both o-ring gaskets 90 can have frames 130 protruding from their surfaces that fit around the perimeters of the components to which they are adjacent. As discussed above, these frames 130 also aid in properly positioning the gasket 90.

Also, the second o-ring gasket 90 can have one or more notches 140 that allow for electrical connections to be made to the heater 150, enabling the temperature of the heater 150 to be regulated. These notches 140 also can be of such a geometry that the heater 150 only fits through the notch 140 in one orientation. This aids in properly positioning the heater 150.

According to certain embodiments, the o-rings 110 in the second o-ring gasket 90 can be of a thickness that is greater than the combined thickness of the web 100 and heater 150. That way, the o-ring 110 can go completely through an opening in the heater 150 and form seals with the injection die and the second diffusion bonded plate 80.

To summarize, when positioning the components illustrated in FIG. 6 relative to each other, the tool posts 120, frames 130, notches 140 and dimples 160 are used. When each of the tool posts 120 is positioned in a dimple 160 and/or when the frame 130 is properly fit around one or more of the components adjacent to the gasket 90, the apertures or o-rings 110 are properly positioned around either an inlet 30 or outlet 40 to accommodate the formation of a seal. Hence, forming seals becomes easier and more reliable. Also, since certain gaskets 90 of the present invention can only be properly positioned in one orientation, the placement of the gasket 90 is simplified since the user does not have difficulty in determining front from back and top from bottom of the gasket 90.

Further, some gaskets 90 according to the present invention have fewer, less complex parts than some earlier sealing mechanisms that incorporated separate o-rings that were not included in webbing. Even further, some gaskets 90 according to the present invention are easier to clean.

In certain embodiments, only some of the o-rings 110 are positioned around inlets 30 and outlets 40 while other o-rings 110 are used as compressive stress distributors. The stress-distributing o-rings 110 can be filled in since they do not need to allow gas to flow through.

The foregoing detailed description has been given for understanding exemplary implementations of the invention only and no unnecessary limitations should be understood there from as modifications will be obvious to those skilled in the art without departing from the scope of the appended claims and their equivalents.

What is claimed is:

1. A gasket for sealing an interface to a micro-machined device comprising:
    a web for placement adjacent to the micro-machined device wherein the web includes an aperture; and
    a first tool post protruding a first distance from a first surface of the web; and
    a second tool post protruding a first distance from the first surface of the web, wherein the first distance is not equal to the second distance.

2. The gasket of claim 1, wherein the aperture comprises an o-ring.

3. The gasket of claim 2, wherein the o-ring comprises an elastomer.

4. The gasket of claim 1, further comprising a frame on a second surface of the web opposite the first surface.

5. The gasket of claim 4, wherein the frame includes a notch.

6. A gasket for creating an interface to a micro-machined device comprising:
    a web for placement adjacent to the micro-machined device wherein the web includes an aperture;
    a first tool post of a first geometry protruding from a surface of the web;
    a second tool post of a second geometry protruding from the surface of the web, wherein the first geometry is different from the second geometry; and
    a frame protruding from a first surface of the web.

7. The gasket of claim 6, further comprising a tool post protruding from a second surface of the web opposite the first surface.

8. The gasket of claim 6, wherein the web comprises a rigid material.

9. The gasket of claim 6, wherein the aperture comprises an o-ring.

10. The gasket of claim 6, wherein the frame includes a notch.

11. A micro-injector comprising:
    an injector die;
    a first o-ring gasket adjacent to a first surface of the injector die, wherein the first o-ring gasket includes:
        a web adjacent to the injector die;
        an o-ring in the web; and
        a tool post protruding from a surface of the web; and
    a heater adjacent to a second surface of the injector die.

12. The micro-injector of claim 11, further comprising a second o-ring gasket adjacent to a second surface of the injector die.

13. The micro-injector of claim 11, further comprising a dimple in the injector die to accommodate the tool post.

14. The gasket of claim 11, wherein the web comprises a rigid material.

15. The gasket of claim 11, wherein the o-ring comprises an elastomer.

16. A micro-injector comprising:
    an injector die;
    a first o-ring gasket adjacent to a first surface of the injector die, wherein the first o-ring gasket includes:
        a web adjacent to the injector die;
        an o-ring in the web; and
        a tool post protruding from a surface of the web;
    a heater adjacent to a second surface of the injector die; and
    a frame protruding from the web.

17. The gasket of claim 12, wherein the frame includes a notch.

18. The gasket of claim 12, wherein the frame comprises a smaller perimeter than a perimeter of the injector die.

19. A micro-injector comprising:
an injector die;
a first o-ring gasket adjacent to a first surface of the injector die, wherein the first o-ring gasket includes:
  a web adjacent to the injector die;
  an o-ring in the web; and
  a tool post protruding from surface of the web;
a heater adjacent to a second surface of the injector die;
a diffusion bonded plate adjacent to the first o-ring gasket; and
a feature in the diffusion-bonded plate to accommodate the tool post.

* * * * *